(12) United States Patent
Bohr (10) Patent No.: US 6,919,238 B2
(45) Date of Patent: Jul. 19, 2005

(54) SILICON ON INSULATOR (SOI) TRANSISTOR AND METHODS OF FABRICATION

(75) Inventor: Mark Bohr, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/208,890

(22) Filed: Jul. 29, 2002

(65) Prior Publication Data

US 2004/0018672 A1 Jan. 29, 2004

(51) Int. Cl.[7] ............................................. H01L 21/84
(52) U.S. Cl. ........................................ 438/166; 438/279
(58) Field of Search ................................. 438/151–166, 438/279

(56) References Cited

U.S. PATENT DOCUMENTS

| 4,381,202 A | * | 4/1983 | Mori et al. ................ 438/481 |
| 4,467,518 A | * | 8/1984 | Bansal et al. .............. 438/153 |
| 4,489,478 A | * | 12/1984 | Sakurai ...................... 438/18 |
| 5,273,921 A | * | 12/1993 | Neudeck et al. ........... 438/157 |
| 5,278,093 A | * | 1/1994 | Yonehara .................... 438/479 |
| 5,318,663 A | * | 6/1994 | Buti et al. .................. 438/404 |
| 5,670,387 A | * | 9/1997 | Sun ............................ 438/155 |
| 5,849,612 A | * | 12/1998 | Takahashi et al. .......... 438/151 |
| 6,040,200 A | * | 3/2000 | Hayashi et al. ............. 438/30 |
| 6,391,695 B1 | * | 5/2002 | Yu .............................. 438/166 |
| 2001/0001716 A1 | * | 5/2001 | Joo et al. .................... 438/151 |

* cited by examiner

*Primary Examiner*—Richard A. Booth
(74) *Attorney, Agent, or Firm*—Blakely, Sokoloff, Taylor & Zafman LLP (57) ABSTRACT

The present invention is a silicon on insulator (SOI) transistor and its method of fabrication. According to the present invention, an opening is formed in the insulating layer formed on a single crystalline silicon substrate. An amorphous or polycrystalline silicon or silicon alloy is then formed in the opening on the single crystalline silicon substrate and on the insulating layer. The amorphous or polycrystalline silicon or silicon alloy in the opening and at least a portion of the amorphous or polycrystalline silicon or silicon alloy on the insulating layer is crystallized into a single crystalline silicon or silicon alloy film.

40 Claims, 6 Drawing Sheets

SILICON ON INSULATOR (SOI) TRANSISTOR AND METHODS OF FABRICATION

BACKGROUND OF THE INVENTION

1. Field of the Invention

The present invention relates to the field of semiconductor devices and more specifically to a silicon on insulator (SOI) transistor and methods of fabrication.

2. Discussion of Related Art

Figure 1:
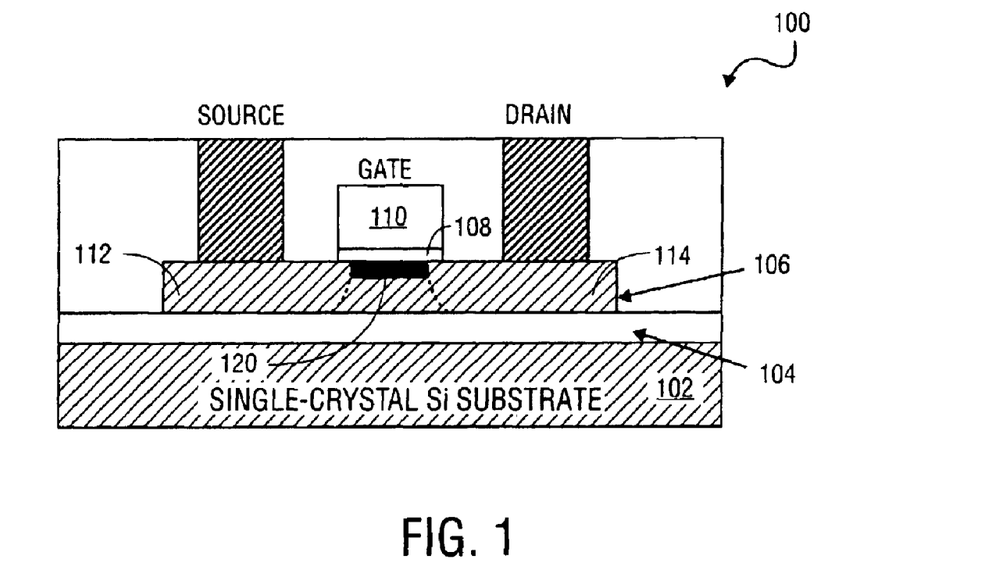
FIG. 1 is an illustration of a cross-sectional view of a prior art partially depleted silicon on insulator (SOI) transistor.

In order to increase device performance, silicon on insulator (SOI) transistors have been proposed for the fabrication of modern integrated circuits. FIG. 1 illustrates a standard partially depleted silicon on insulator (SOI) transistor 100. SOI transistor 100 includes a single crystalline silicon substrate 102 having an insulating layer 104, such as a buried oxide formed thereon. A single crystalline silicon film body 106 is formed on the insulating layer 104. A gate dielectric layer 108 is formed on the single crystalline silicon body 106 and a gate electrode 110 formed on the gate dielectric 108. Source and drain regions 112 and 114 are formed in silicon body 106 along laterally opposite sides of gate electrode 110.

There are presently a couple different methods of forming SOI substrates where an single crystalline silicon body 106 is formed on an insulating layer 104 which inturn is formed on a single crystalline silicon substrate. In one method of forming a silicon on insulator (SOI) substrate, known as the SIMOX technique, oxygen atoms are implanted at a high dose into a single crystalline silicon substrate and annealed to form the buried oxide 104 within the substrate. The portion of the single crystalline silicon substrate above the buried oxide becomes the silicon body. Another technique currently used to form SOI substrates is an epitaxial silicon film transferred technique. Another technique currently used to form SOI substrates is generally referred to as bonded SOI. In this technique a first silicon wafer has a thin oxide grown on its surface that will later serve as the buried oxide in the SOI structure. Next a high dose hydrogen implant is done to form a high stress region below the silicon wafer surface. This first wafer is then flipped over and bonded to the surface of a second silicon wafer. The first wafer is then cleaved along the high stress plane created by the hydrogen implant. This results in the SOI structure with a thin silicon layer on top, buried oxide underneath, all on top of a single crystal silicon substrate.

A problem with the bonded technique and the oxygen implant technique for forming SOI wafers or substrates, is that they cannot form thin, less than 100 nm uniform epitaxial silicon body films. As such, the silicon body 106 of an SOI transistor formed with these techniques have thicknesses of greater than 100 nanometers. As such, when the SOI transistor is in operation and "turned ON" and the channel region 120 of the device inverts into the conductivity of the source/drain regions to form a conductive channel therebetween the inverted conductive channel region 120 does not completely invert or deplete the entire thickness of the silicon body. As such, the SOI transistor is considered a partially depleted SOI transistor and not a fully depleted transistor. In order to fully deplete the silicon body, the silicon body film would need to be less than 30 nm. A fully depleted SOI transistor has better electrical performance and characteristics than does a partially depleted SOI transistor. As such, present techniques are unable to fabricate fully depleted SOI transistors.

DETAILED DESCRIPTION OF THE PRESENT INVENTION

The present invention is a novel silicon on insulator (SOI) transistor and its method of fabrication. In the following detailed description, numerous specific details are set forth in order to provide a thorough understanding of the present invention. In other instances, well-known semiconductor processing techniques have not been described in particular detail in order to not unnecessarily obscure the present invention.

The present invention is a novel SOI transistor and its method of fabrication. The SOI transistor is fabricated utilizing the lateral crystallization of a thin deposited amorphous or polycrystalline silicon or silicon alloy that contacts a single crystalline silicon substrate through a small seed window in the insulating layer. The process of the present invention can be used to form very thin (less than 30 nanometers) and uniform thickness single crystalline silicon films for the body of the transistor enabling fully depleted SOI transistors to be fabricated across a wafer. In an embodiment of the present invention, a polished stop layer along with a polishing planarization step are used to precisely control the thickness and uniformity of the silicon or silicon alloy body.

SOI Transistors

Figure 2:
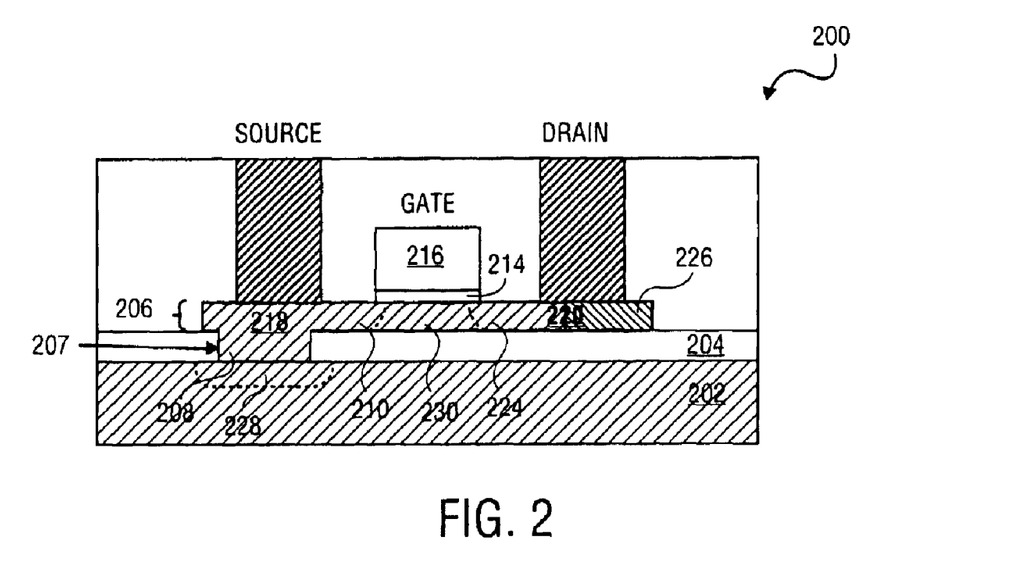
FIG. 2 is an illustration of an silicon on insulator (SOI) transistor in accordance with an embodiment of the present invention.

Shown in FIG. 2 is an SOI transistor 200 in accordance with an embodiment of the present invention. Transistor 200 includes a single crystalline silicon substrate 202. Single crystalline silicon substrate 202 can include a top deposited silicon or silicon alloy epitaxial film. An insulating layer 204, such as silicon dioxide or silicon nitride, is formed on the single crystalline silicon substrate 202. A semiconductor body film 206 is formed on the insulating layer 204. Semiconductor body film 206 can be a silicon film or a silicon alloy film, such as silicon germanium ($Si_xGe_y$). A single crystalline window portion 208 connects the silicon or silicon alloy body film 206 to the single crystalline silicon substrate 202 through a window or opening 207 formed in insulating layer 204. The silicon or silicon alloy body film includes at least a single crystalline silicon or silicon alloy portion 210 from which the active channel region of the device is formed. The active channel region 230 is formed by the lateral crystallization of an amorphous or polycrystalline silicon or silicon alloy film deposited on the insulating layer 204 and on the single crystalline silicon substrate 202 within the opening 207. A heating step causes crystallization of the body film to start from the single silicon substrate 202 in the window and laterally extend a length across insulating layer 204. The length of crystallization is on the order of 1.0 micron so that a device's active or channel region 230 can be formed within the crystallization region.

A gate dielectric layer 214, such as silicon dioxide or silicon oxynitride, is formed on the single crystalline silicon or silicon alloy body portion 210. A gate electrode 216, such as a highly doped polycrystalline silicon gate electrode 216, is formed on the gate dielectric layer 214. A source region 218 and a drain region 220 are formed in the silicon or silicon alloy body film 206 on laterally opposite sides of gate electrode 216. The source and drain regions have the same doping concentration and conductivity type wherein the channel region of the silicon body is of the opposite conductivity type and of lower doping. In an embodiment of the present invention, for a NMOS device the source and drain regions are of n type conductivity and have a doping density of between $10^{20}$–$10^{22}$ cm$^{-3}$ while the channel region is of p type conductivity and has a doping density of between $10^{17}$–$10^{19}$ cm$^{-3}$. For a PMOS device the source and drain regions have a p type conductivity and a doping density of between $10^{20}$–$10^{21}$ cm$^{-3}$ while the channel region has a n type conductivity and a doping density of between $10^{17}$–$10^{19}$ cm$^{-3}$.

In an embodiment of the present invention, the drain region 220 has a single crystalline silicon or silicon alloy portion 224 formed by crystallization and an amorphous or polycrystalline silicon portion 226 which is not crystalized. In an embodiment of the present invention, the drain region is formed of only silicon crystalline silicon or silicon alloy and does not include an amorphous or polycrystalline silicon portion 226. The drain region 220 is completely isolated from monocrystalline silicon substrate 202 by insulating layer 204.

The source region 218 is formed in single crystalline silicon body portion 210. In an embodiment of the present invention, source region 218 also includes single crystalline silicon window portion 208 and a portion 228 of single crystalline silicon substrate 202. Directly connecting the silicon body layer 206 to the single crystalline silicon substrate 202 through seed window 207 provides a thermal heat sink advantage to the SOI transistor of the present invention. Alternatively, source region 218 can include only single crystalline silicon body portion 210 and be completely isolated by insulator 204 from monocrystalline silicon substrate 202.

When the SOI transistor is turned "ON" a depletion region is formed in channel region 230 along with an inversion layer at the surface of region 230. The inversion layer has the same conductivity type as the source and drain regions and forms a conductive channel between the source 218 and drain 220 regions to allow current to flow there between. The depletion region depletes free carriers from beneath the inversion layer. This depletion region extends to the bottom of region 230, thus the SOI transistor can be said to be a fully depleted SOI transistor. Full depleted SOI transistors have improved electrical performance characteristics over non-fully depleted, or partially depleted SOI transistors.

Methods of Fabrication of SOI Transistors

Figure 3A:
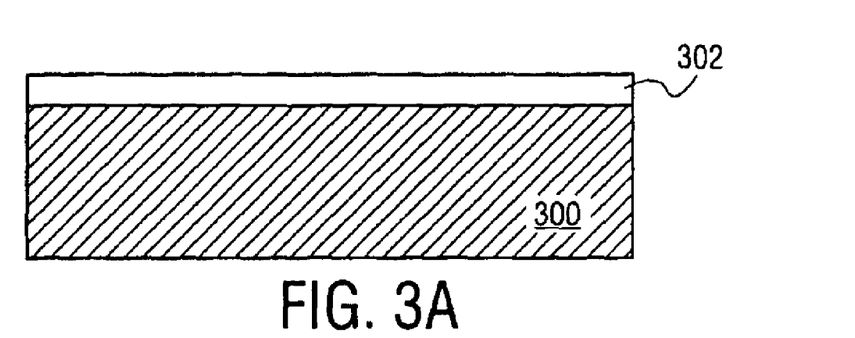
FIGS. 3A–3H illustrates a method of forming an SOI transistor in accordance with an embodiment of the present invention.

Fabrication of the SOI transistor in accordance with embodiments of the present invention, will be described with respect to FIGS. 3A–3H and FIGS. 4A–4F. In a method of forming a silicon on insulator (SOI) semiconductor device in accordance with an embodiment of the present invention, a single crystalline substrate 300, such as a single crystalline silicon substrate is provide as shown in FIG. 3A. In an embodiment of the present invention, the single crystalline silicon substrate 300 is doped with impurities to form a p type conductivity substrate with a doping concentration of between $10^{15}$–$10^{18}$ cm$^{-3}$. Monocrystalline silicon substrate 300 can include a top deposited epitaxial film, if desired. An insulating layer 302 is formed on single crystalline silicon substrate 300 as also shown in FIG. 3A. Insulating layer 302 is of a sufficient thickness and quality to isolate a subsequently formed semiconductor body from single crystalline substrate 300. Insulating layer 302 can be any suitable insulating layer, such as silicon dioxide or silicon nitride. In an embodiment of the present invention, insulating layer 302 is an oxide film formed by thermal oxidation utilizing a wet ambient and is formed to a thickness of approximately 100 nanometers.

Figure 3B:
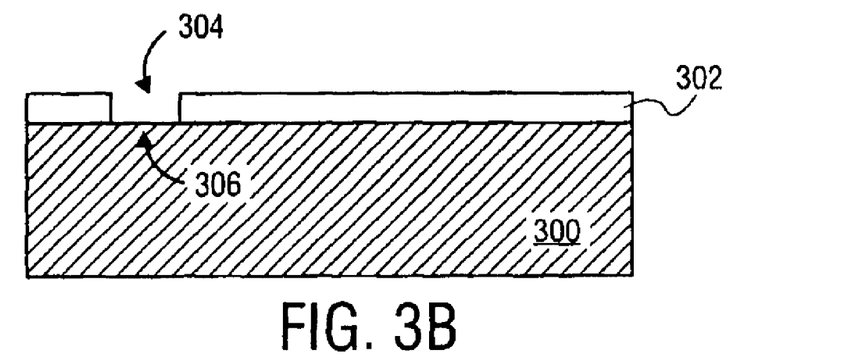

Next, as shown in FIG. 3B, a seed window or opening 304 is formed in insulating layer 302 to expose a portion of underlying single crystalline substrate 300. Opening 304 exposes a portion 306 of silicon substrate 300 which will be subsequently used as a seeding site from which to laterally crystallize a subsequently formed silicon body layer for the SOI transistor of the present invention. Opening 304 can be made as small as the critical dimension or minimum of feature size of the process used to fabricate the transistor. In an embodiment of the present invention, the window has a width of approximately 60 nanometers.

Figure 3C:
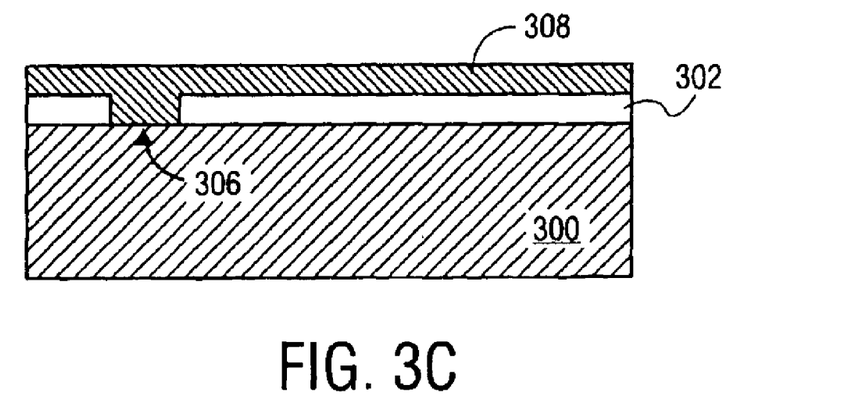

Next, as shown in FIG. 3C, a thin semiconductor body film 308 is formed on portion 306 of single crystalline silicon substrate 300 in window 304 and on insulating layer 302. Semiconductor body film 308 can be an amorphous or polycrystalline silicon film or an amorphous or polycrystalline silicon alloy film, such as silicon germanium. In an embodiment of the present invention, silicon body 308 is an amorphous or polycrystalline silicon or silicon alloy film which is deposited in a two step deposition process. The first deposition process is a selective deposition and as such, only deposits on silicon areas, such as silicon substrate region 306 in window 304, and not on insulating layer 302. The second deposition step is a non-selective deposition which deposits silicon on the previously deposited silicon within window 304 as well as on insulating layer 302. The thickness of semiconductor body layer 308 is chosen so that the entire channel region of a transistor formed on the silicon body will fully deplete when the transistor is turned "ON". In an embodiment of the present invention, silicon body layer 308 is formed to a thickness less than 30 nanometers and ideally to a thickness of approximately 20 nanometers plus or minus two nanometers over the entire surface of a wafer.

Figure 3D:
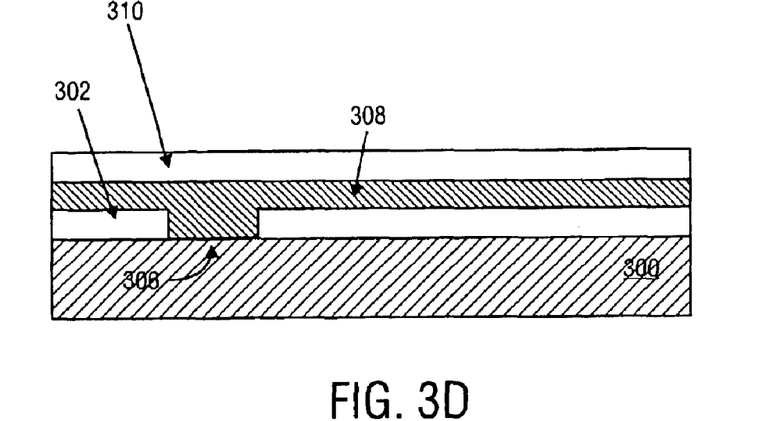

Next, a dielectric capping layer 310 is formed on silicon body film 308 as shown in FIG. 3D. Dielectric capping layer 310 can be used to keep the top surface of silicon body 308 smooth during the subsequent lateral crystallization step. Dielectric capping layer 310 can be any suitable dielectric layer, such as silicon dioxide or silicon nitride formed to a thickness of approximately 100 nm.

Figure 3E:
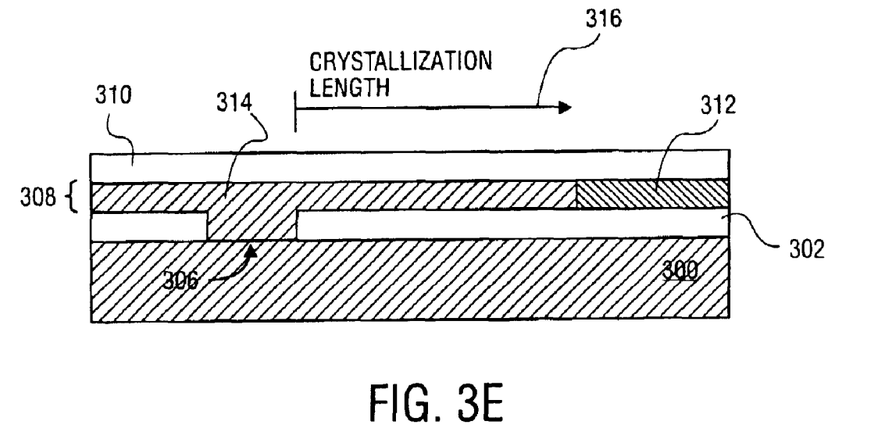

Next, silicon or silicon alloy body 310 is crystallized to form a single crystalline silicon or silicon alloy film portion 314 as shown in FIG. 3E. A high temperature anneal can be used to laterally crystallize the silicon body film 308. Crystallization begins at the silicon seed portion 307 and then grows laterally over insulating layer 302 as shown in FIG. 3E. The crystallization length 316 should be sufficiently long in order to provide a sufficient amount of single crystalline silicon or silicon alloy film 314 for at least one transistors active channel region. In an embodiment of the present invention, the crystallization length 316 is sufficiently long to provide single crystalline silicon for multiple transistors. In an embodiment of the present invention, the crystallization length is on the order of approximately 1.0 micron. The crystallization step need not crystallize the entire silicon or silicon body 308 and can leave a portion 312 as amorphous or polycrystalline silicon or silicon alloy, as shown in FIG. 3E. Ideally, the crystallization anneal is accomplished with a method that provides a thermal gradient which keeps the silicon seed portion 306 of substrate 300 relatively cool while heating the silicon body 308. In this way, the crystalline structure of the seed layer 306 remains aligned while the silicon body layer heats up, melts and aligns to the crystalline structure of the seed area 306 of single crystalline substrate 300. In an embodiment of the present invention, a laser anneal process is used to form single crystalline silicon or silicon alloy body portion 314. In the case of laser anneal, the wavelength of light chosen would be such that most of the radiant energy is absorbed in the silicon, or silicon alloy layer 308 and not in the dielectric layer or in the underlying silicon substrate 300. In an alternative embodiment of the present invention, a rapid thermal process (RTP) may be utilized. The anneal temperature time, and/or energy is utilized to control the crystallization length 316 of silicon body portion 314. At this point, a single crystalline silicon or silicon alloy film 314 has been formed on an insulating layer 302 enabling the subsequent formation of a silicon on insulator transistor. Well-known and standard process techniques can now be used to complete the fabrication of a silicon on insulator transistor.

Figure 3F:
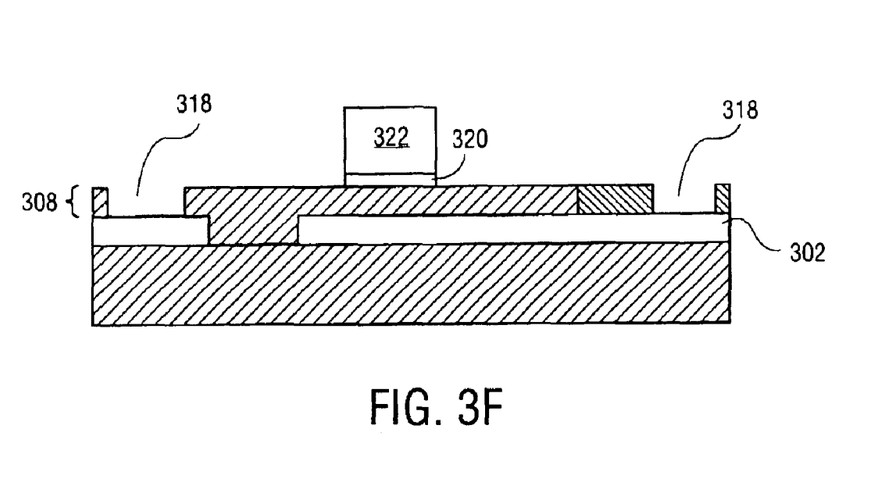

For example, as shown in FIG. 3F, the dielectric capping layer 310 is now removed from silicon body 308. At this time, well-known ion-implantation techniques can be used to dope silicon body 308 to p type conductivity for n type devices and n type conductivity for p type devices. Well-known masking and doping techniques, such as ion-implantation or solid source diffusion may be utilized to dope silicon body 308. Next, as also shown in FIG. 3F, silicon body 308 is patterned with well-known photolithography and etching techniques to remove portions of silicon body 308 to form openings 318 in the silicon body film in order to electrically isolate adjacent transistors. Next, as also shown in FIG. 3F, a gate dielectric layer 320, such as a silicon dioxide or silicon oxynitride film, is grown on silicon body 308 with well-known techniques. Next, a gate electrode material, such as polycrystalline silicon, is deposited on the gate dielectric layer. Next, well-known photolithograph and etching techniques are utilized to pattern the gate electrode material and gate dielectric layer into a gate electrode 322 and gate dielectric 320 as shown in FIG. 3F. It is to be appreciated that gate electrode 322 and gate dielectric 320 are positioned over single crystalline silicon or silicon alloy portion 314 of silicon body 308 as shown in FIG. 3F.

Figure 3G:
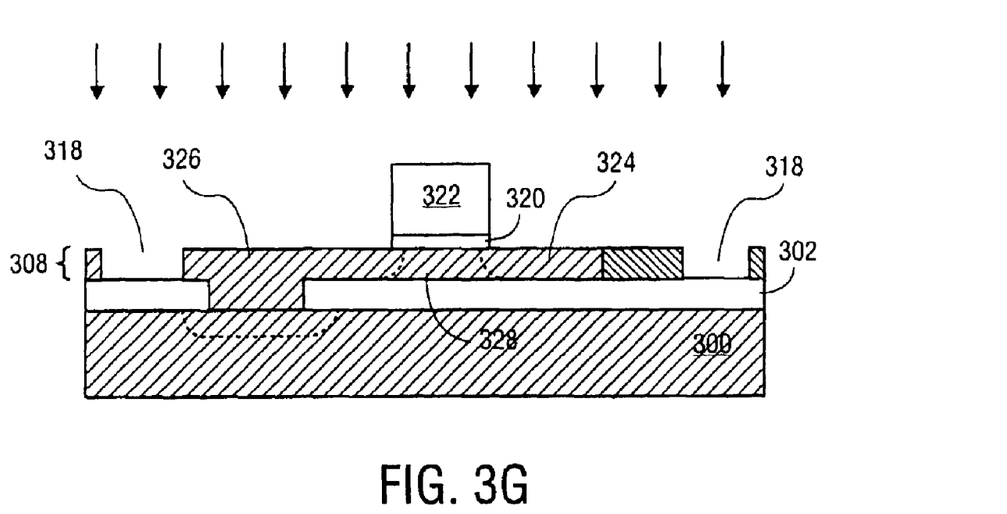

Next, a source region 326 and a drain region 324 are formed in silicon body 308 as shown in FIG. 3G. Source region 326 and drain region 324 are formed along laterally opposite sidewalls of gate electrode 322 defining a channel region 328 therebetween. Source region 326 and drain region 324 are formed of n type conductivity for NMOS devices and a p type conductivity for PMOS devices. Source region 326 and drain region 324 can be formed with well-known techniques, such as ion-implantation or solid source diffusion. In an embodiment of the present invention, the source region and drain region are formed by ion-implantation. The source/drain doping step can be used to highly dope a polycrystalline gate electrode 322. In an embodiment of the present invention, the drain region 324 formed and located so that it includes a portion of single crystalline silicon body 314 and a portion 312 of amorphous or polycrystalline silicon body. Additionally, in an embodiment of the present invention, as shown in FIG. 3G, source region 326 is formed and located so that the source region includes single crystalline silicon or silicon alloy 314 formed in window 304 of insulating layer 302 as well as a portion of single crystalline silicon substrate 300. At this point, the fabrication of the silicon on insulator transistor of the present invention is complete.

Well-known semiconductor fabrication processes can now be utilized to interconnect the fabricated SOI transistor with other transistors formed on substrate 300 to form an integrated circuit. For example, well-known interlayer dielectric fabrication techniques can be used to form an interlayer dielectric 330 and well-known contact techniques can be utilized to form source, drain and gate contacts 332 to enable electrical coupling by metallization layers 334 to other devices in the integrated circuit.

It is to be appreciated that the present invention utilizes a lateral crystallization of a deposited amorphous or polycrystalline silicon film to form a single crystalline silicon film on which the SOI transistor of the present invention is subsequently formed. Because the present invention relies upon the lateral crystallization, it is desirable to keep the lateral crystallization length (i.e., distance the single crystalline silicon grows from the seed area over insulating layer 302 as shown in FIG. 3D) short as possible in order to insure a quality single crystalline silicon film. Accordingly, in an embodiment of the present invention, the crystallization length is kept to less than 10 microns and greater than 1 microns. It is to be appreciated that because it is desirable to reduce the crystallization length, many (literally millions) of seed windows 304 would be formed in an insulating layer 302 for each integrated circuit in order to provide a sufficient amount of crystallized single crystalline silicon from which to form the SOI transistors of the integrated circuit. In an embodiment of the present invention, there is between 1:1 to 1:10 ratio crystallization seed windows to transistors. It is to be appreciated that the crystallization of the amorphous or polycrystalline silicon body film 308 begins at the seeding cite 306 and grows in all directions (including into and out of the page in FIG. 3E). Additionally, it is to be appreciated that windows 306 also extend into and out of the page along the gate width of the transistor. (As in typical convention, the gate length of a transistor refers to the dimension of the gate electrode separating the source and drain regions as shown in FIGS. 3A–3H while the gate width is the direction perpendicular thereto (i.e., in a direction into and out of the page of FIGS. 3A–3H).)

Figure 3H:
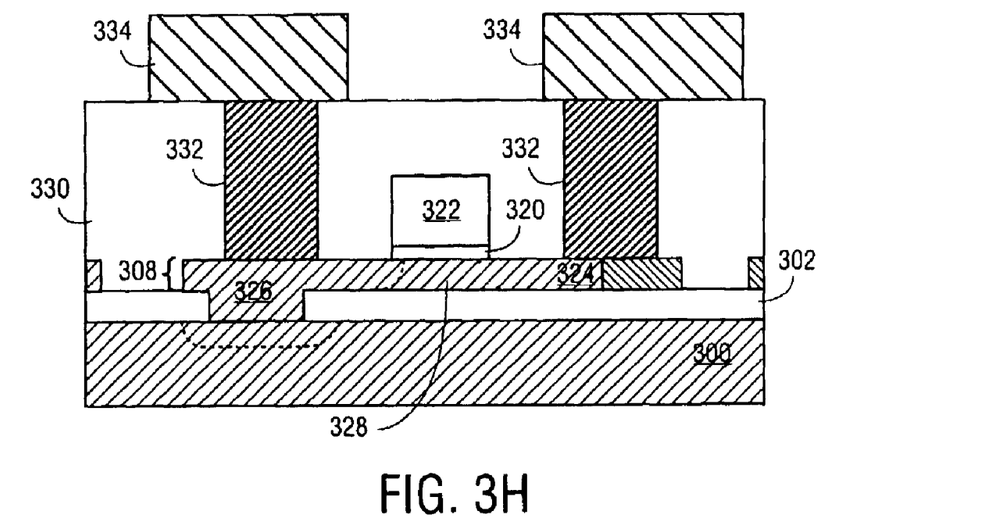

Thus, accordingly the present invention forms multiple seed windows 304 in insulating layer 302 to provide multiple seeding sites from which a deposited amorphous or polycrystalline silicon film can be crystallized into single crystalline silicon for the various SOI transistors of an integrated circuit. In an embodiment of the present invention, sufficient seed windows are formed and located to insure the complete crystallization of the entire amorphous or polycrystalline silicon film during the crystallization step. It is to be appreciated, however, that the entire amorphous or polycrystalline silicon film need not necessarily be crystallized into single crystalline silicon and some can remain as polycrystalline or amorphous silicon as long as the transistor layout restrictions place the active channel regions over crystallized silicon 314. If some of the silicon body remains as amorphous or polycrystalline silicon, the SOI transistors should be located so that the amorphous or polycrystalline silicon film forms part of the drain region of the device as shown in FIG. 3H. Additionally, although the silicon body 308 is shown connected to the single crystalline silicon substrate 300 by the portion of silicon in window 304, the silicon body need not necessarily be directly coupled to the substrate. For example, the transistors can be properly positioned so that the silicon in or above window 304 can be etched away or isolated from the silicon body during the silicon body etch step of FIG. 3F to provide isolation between adjacent transistors.

Figures 4A, 4B:
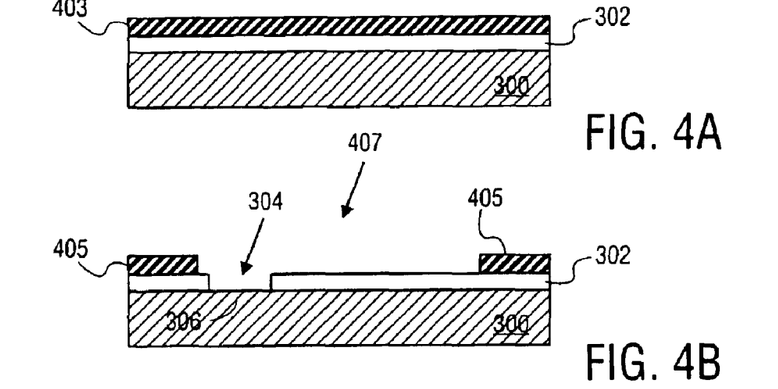
FIGS. 4A–4F illustrates a method of forming an SOI transistor in accordance with an embodiment of the present invention.

In a method of forming an SOI transistor in accordance with another embodiment of the present invention, as shown in FIGS. 4A–4F, the deposited silicon body is thinned by a polishing process and the thickness precisely controlled by the use of a thin polish stop layer. According to this embodiment of the present invention, a polish stop film 403 is conformally formed on insulating layer 302 formed on single crystalline silicon substrate 300 as shown in FIG. 4A. The polish stop layer 403 is used to form a plurality of polish stops on insulating layer 302 for the subsequent polishing of the deposited silicon body film. As such, the polish stop film is formed of a material which can be selectively polished with respect to the subsequently formed silicon body. (That is polish stop film 403 is formed of a material which can be polished slower, preferably at least 5 times slower, than the silicon body film.) In an embodiment of the present invention, the polish stop is a deposited silicon nitride, silicon oxide or silicon carbide film. The polish stop film 403 is deposited to the thickness desired of the silicon body for the SOI transistor. In an embodiment of the present invention, the polish stop layer 403 is formed to a thickness of less than 40 nanometers and ideally to a thickness of less than or equal to 20 nanometers so that a fully depleted SOI transistor can be formed.

Next, as shown in FIG. 4B, the polish stop layer 403 is patterned with well-known photolithography and etching techniques to form a plurality of polish stop features 405 on insulating layer 302. The region 407 between polish stop features 405 are the location at which an SOI transistor or plurality of transistors are formed. As such, the spaces between features should be at least sufficient to accommodate at least one SOI transistor. In an embodiment of the present invention, polish stop features 405 are separated by a distance of at least 1.0 micron in order to provide sufficient area for the transistors length.

Next, as also shown in FIG. 4B, a silicon seed window 304 is formed through insulating layer 302 to expose a portion 306 of single crystalline substrate 300 as described above. Seed window 304 is formed within opening 407 between polish stop features 405.

Figure 4C:
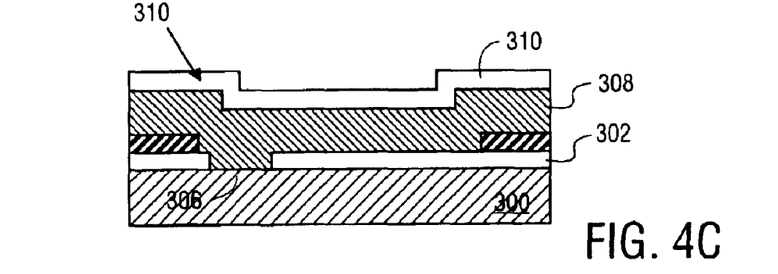

Next, as shown in FIG. 4C, an amorphous or polycrystalline silicon or silicon alloy body film 308 is blanket deposited onto polish stop features 405, onto insulating layer 302 within opening 407 and onto single crystalline silicon substrate portion 306 of substrate 300. In this embodiment of the present invention, the amorphous or polycrystalline silicon body film can be deposited to a thickness greater than the thickness desired of the body layer for the fabricated transistor because it is to be subsequently polished back. It is thought that by forming a thicker amorphous or polycrystalline silicon body layer 308 that the subsequent lateral crystallization anneal can obtain further lengths do to the increased thickness of the film. In an embodiment of the present invention, the amorphous or polycrystalline silicon or silicon alloy film 308 is formed to a thickness greater then 100 nanometers. Amorphous or polycrystalline silicon or silicon alloy film 308 can be formed with techniques as described above.

Next, a dielectric capping layer 310 is formed on amorphous or polycrystalline silicon or silicon alloy layer 308 as described above.

Figure 4D:
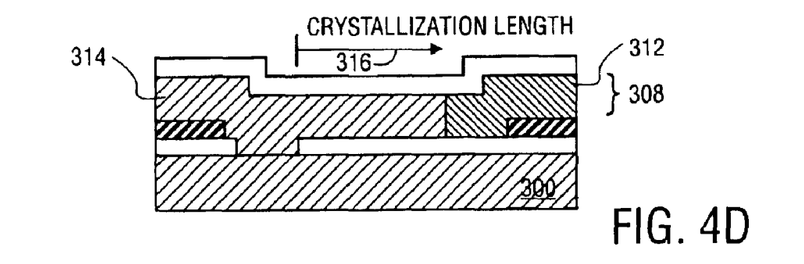

Next, as shown in FIG. 4D, the amorphous or polycrystalline silicon or silicon alloy film 308 is subjected to a high temperature anneal to laterally crystallize the film 308 to form a single crystalline silicon or silicon alloy film 314 as described above. It is thought that by increasing the thickness of the silicon body film 308 that the lateral crystallization length can be increased over what is possible when a thin amorphous or polycrystalline silicon or silicon alloy body film is crystallized. A portion 312 of the amorphous or polycrystalline silicon or silicon alloy body film 308 may remain as amorphous or polycrystalline silicon or silicon alloy as shown in FIG. 4D.

Figure 4E:
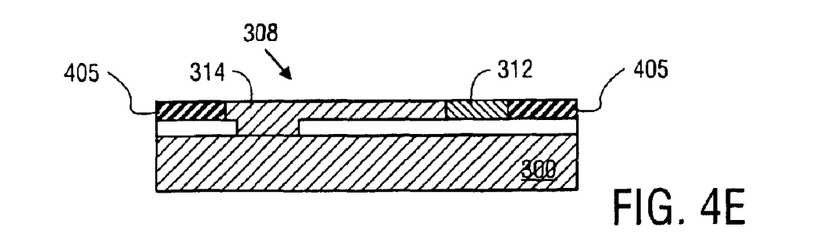

Next, as shown in FIG. 4E, the dielectric capping layer is removed with well-known techniques. The silicon body layer 308 is now polished back with well-known chemical mechanical polishing techniques. The silicon body layer 308 is polished down to the polish stop features 405 as shown in FIG. 4E. The silicon body is polished with a polishing process and slurry which can selectively polish the silicon body film 308 with respect to polish stop features 405. The polishing process is continued until all of the silicon body film 308 is removed from polish stop features 405 as shown in FIG. 4E. After the polishing process, the top surface of silicon body 308 is substantially planar with the top surface of the polish stop features 405 as shown in FIG. 4E. In this embodiment of the present invention, there is no need to etch the silicon body layer in order electrically isolated adjacent transistors because the polish stop features 405 can be placed in appropriate locations to provide such a function. By utilizing a polishing process and polish stop features 405, a silicon body 308 on which SOI transistor of the present invention is fabricated can formed to a precise and uniform thickness across the wafer and from wafer to wafer.

Figure 4F:
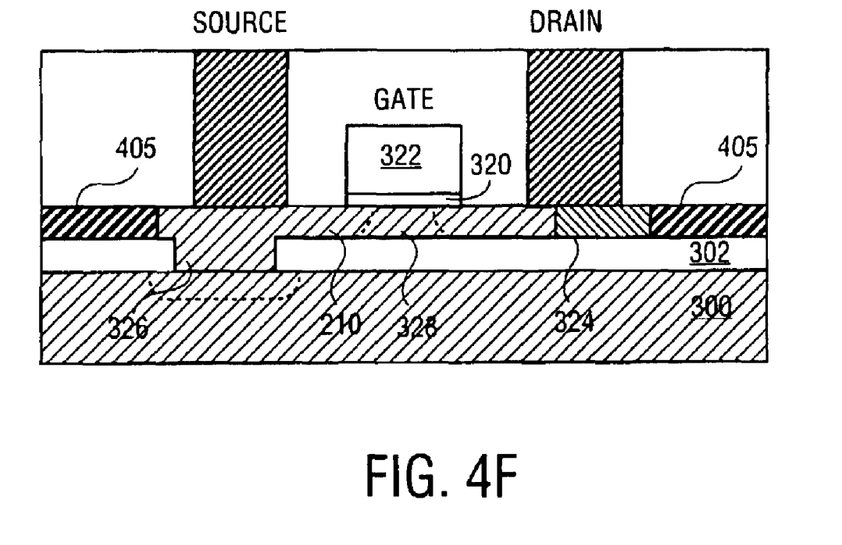

Next, as shown in FIG. 4F, a gate dielectric layer 320, a gate electrode 322, a source region 326 and a drain region 324 are formed as described above. This completes the fabrication of the SOI transistor in accordance with an alternative embodiment of the present invention.

Thus, an SOI transistor and its methods of fabrication have been described.

We claim:

1. A method of forming a semiconductor device comprising:
    forming a polish stop layer on an insulating layer formed on a single crystalline silicon substrate;
    forming an opening in said polish stop layer;
    forming an opening in said insulating layer formed on said single crystalline silicon substrate within said opening in said polish stop layer;
    forming an amorphous or polycrystalline silicon or silicon alloy layer in said opening in said insulating layer on said single crystalline silicon substrate and on said insulating layer;
    forming a dielectric capping layer on said amorphous in polycrystalline silicon or silicon alloy layer;
    crystallizing said amorphous or polycrystalline silicon or silicon alloy film in said opening and at a least a portion of said amorphous or polycrystalline silicon or silicon alloy film formed on said insulating layer into a single crystalline silicon or silicon alloy film while said dielectric capping layer is on said amorphous or polycrystalline silicon or silicon alloy layer; and
    forming a source region and a drain region in the opposite ends of said single crystalline silicon or silicon alloy film, wherein said opening is located beneath the source region but not the remaining portions of said single crystalline silicon or silicon alloy film.

2. The method of claim 1 further comprising forming a gate dielectric layer on said single crystalline silicon or silicon alloy portion on said insulating layer; and forming a gate electrode on said gate dielectric.

3. The method of claim 1 wherein the length of said crystallized portion of said single crystalline or silicon alloy film on said insulating layer is greater than 1.0 micron.

4. The method of claim 1 wherein said source region and said a drain region exist on opposite sides of said gate electrode in said silicon or silicon alloy film.

5. The method of claim 4 wherein said source region includes said single crystalline silicon or silicon alloy film in said opening.

6. The method of claim 4 wherein said drain region includes a single crystalline silicon or silicon alloy portion and an amorphous or polycrystalline silicon or silicon alloy portion.

7. The method of claim 1 wherein said amorphous or polycrystalline silicon or silicon alloy film is formed to a thickness less than 30 nanometers.

8. The method of claim 1 wherein said crystallization step comprises a laser anneal.

9. The method of claim 1 wherein said crystallization step includes a high temperature anneal.

10. A method of forming a semiconductor device comprising:
    forming a polish stop layer on an insulating layer formed on a single crystalline silicon substrate;
    forming an opening in said polish stop layer;
    forming an opening in said insulating layer within said opening in said polish stop layer;
    forming an amorphous or polycrystalline silicon or silicon alloy film on said single crystalline silicon substrate in said opening of said insulating layer, on said insulating layer within said opening in said polish stop layer, and on said polish stop layer;
    crystallizing said amorphous or polycrystalline silicon or silicon alloy film in said opening in said insulating layer and at least a portion of said amorphous or polycrystalline silicon or silicon alloy film formed on said insulating layer within said polish stop layer into a single crystalline silicon or silicon alloy film; and
    after said crystallizing, polishing said single crystalline silicon or silicon alloy film on said insulating layer until said single crystalline silicon or silicon alloy film is removed from said polish stop layer and is substantially planar with said polish stop layer; and
    forming a source region and a drain region in the opposite ends of said single crystalline silicon or silicon alloy film, wherein said opening in said insulating layer is located beneath the source region but not the remaining portions of said single crystalline silicon or silicon alloy film.

11. The method of claim 10 further comprising forming a gate dielectric layer on said single crystalline silicon or silicon alloy portion on said insulating layer; and forming a gate electrode on said gate dielectric.

12. The method of claim 10 wherein the length of said crystallized portion of said single crystalline silicon or silicon alloy film on said insulating layer is greater than 0.05 micron.

13. The method of claim 10 further comprising forming a dielectric capping layer on said amorphous or polycrystalline silicon or silicon alloy film prior to crystallizing said amorphous or polycrystalline silicon or silicon alloy film.

14. The method of claim 10 further comprising forming a source region and said a drain region on opposite sides of said gate electrode in said silicon or silicon alloy film.

15. The method of claim 14 wherein said source region includes said single crystalline silicon or silicon alloy film in said opening.

16. The method of claim 14 wherein said drain region includes a single crystalline silicon or silicon alloy portion and an amorphous or polycrystalline silicon or silicon alloy portion.

17. The method of claim 10 wherein said amorphous or polycrystalline silicon or silicon alloy film is formed to a thickness greater than 100 nanometers.

18. The method of claim 10 wherein said crystallization step comprises a laser anneal.

19. The method of claim 10 wherein said crystallization step includes a high temperature anneal.

20. The method of claim 10 wherein said polish stop layer is selected from the group consisting of silicon nitride silicon carbide, and silicon oxide.

21. The method of claim 2 wherein the single crystalline silicon or silicon alloy film beneath the gate dielectric is insulated from the single crystalline silicon substrate by the insulating layer so as to form an SOI device.

22. The method of claim 21 wherein the SOI device is a fully depleted SOI device.

23. The method of claim 1 wherein the drain region is insulated from the single crystalline silicon substrate by the insulating layer so as to form an SOI device.

24. The method of claim 11 wherein the single crystalline silicon or silicon alloy film beneath the gate dielectric is insulated from the single crystalline silicon substrate by the insulating layer so as to form an SOI device.

25. The method of clam 24 wherein the SOI device is a fully depleted SOL device.

26. The method of claim 10 wherein the drain region is insulated from the single crystalline silicon substrate by the insulating layer so as to form an SOI device.

27. A method of forming a semiconductor device comprising:
    forming an opening in an insulating layer formed on a single crystalline silicon substrate;
    forming an amorphous or polycrystalline silicon or silicon alloy layer in said opening on said single crystalline silicon substrate and on said insulating layer;
    crystallizing said amorphous or polycrystalline silicon or silicon alloy film in said opening on said single crystalline silicon substrate and on said insulating layer to form a film having a single crystalline silicon or silicon alloy film portion and an amorphous or polycrystalline silicon or silicon alloy film portion;
    after said crystallizing, polishing said film having said single crystalline silicon or silicon alloy film portion and said amorphous or polycrystalline silicon or silicon alloy film portion; and
    forming a source region, a drain region, and a channel region in the single crystalline silicon or silicon alloy film, wherein the channel region is insulated from the single crystalline silicon substrate by the insulating layer and wherein said drain region is insulated from said silicon substrate by said insulating layer and wherein said drain region includes both a single crystalline silicon or silicon alloy portion and an amorphous or polycrystalline silicon or silicon alloy portion.

28. The method of claim 27 wherein the semiconductor device is a fully depleted SOI device.

29. The method of claim 27 wherein the said amorphous or polycrystalline silicon or silicon alloy film is formed to a thickness less than 30 nanometers.

30. The method of claim 27 wherein the drain region is insulated from the single crystalline silicon substrate by the insulating layer.

31. The method of claim 30 further comprising:
forming an opening in said single crystalline silicon or silicon alloy film such that the source region is electrically isolated from the opening in the insulating layer, wherein the source region is insulated from the single crystalline silicon substrate by the insulating layer.

32. A method of forming semiconductor devices comprising:
forming an opening in an insulating layer formed on a single crystalline silicon substrate;
forming a first amorphous or polycrystalline silicon or silicon alloy layer in said opening on said single crystalline silicon substrate utilizing a selective deposition process and forming a second amorphous or polycrystalline silicon or silicon alloy film on said insulating layer using a non-selective deposition process;
crystallizing said amorphous or polycrystalline silicon or silicon alloy film in said opening and at least a portion of said amorphous or polycrystalline silicon or silicon alloy film formed on said insulating layer into a single crystalline silicon or silicon alloy film;
forming a shared source region, a first drain region, and a first channel region in the single crystalline silicon or silicon alloy film, wherein the first channel region is insulated from the single crystalline silicon substrate by the insulating layer; and
forming a second drain region and a second channel region in the single crystalline silicon or silicon alloy film, wherein the second channel region is insulated from the single crystalline silicon substrate by the insulating layer.

33. The method of claim 32 wherein the semiconductor devices are fully depleted SOI devices.

34. The method of claim 32 wherein the said amorphous or polycrystalline silicon or silicon alloy film is formed to a thickness less than 30 nanometers.

35. The method of claim 32 wherein one or both of the drain regions are insulated from the single crystalline silicon substrate by the insulating layer.

36. The method of claim 32 wherein one or both of the drain regions include a single crystalline silicon or silicon alloy portion and an amorphous or polycrystalline silicon or silicon alloy portion.

37. The method of claim 32 wherein the length of said single crystalline silicon or silicon alloy film on said insulating layer is greater than 1.0 micron.

38. The method of claim 27 wherein said source region includes said single crystalline silicon or silicon alloy film in said opening.

39. The method of claim 27 wherein said opening in said insulating layer has a width of approximately 60 nanometers.

40. The method of claim 27 wherein said opening in said insulating layer is as small as a critical dimension or minimum feature size of a process to fabricate a transistor.

* * * * *